(12) United States Patent
Bradley

(10) Patent No.: US 6,738,420 B1
(45) Date of Patent: May 18, 2004

(54) DIGITAL FILTER HAVING AN UPSAMPLER OPERATIONAL AT A FRACTIONAL CLOCK RATE

(75) Inventor: Wayne H. Bradley, West Chicago, IL (US)

(73) Assignee: PrairieComm, Inc., Rolling Meadows, IL (US)

( * ) Notice: Subject to any disclaimer, the term of this patent is extended or adjusted under 35 U.S.C. 154(b) by 777 days.

(21) Appl. No.: 09/624,684

(22) Filed: Jul. 24, 2000

(51) Int. Cl.[7] .............................. H03H 7/30; H03H 7/40
(52) U.S. Cl. ........................ 375/234; 375/236; 375/219; 375/354
(58) Field of Search ................................ 375/362, 216, 375/376, 219, 354, 232, 234, 236; 713/502; 364/724; 708/313, 300; 348/240.2; 369/59.2; 341/61, 143; 379/406.08; 377/43; 370/545

(56) References Cited

U.S. PATENT DOCUMENTS 5,495,203 A * 2/1996 Harp et al. ................. 329/306
5,943,378 A * 8/1999 Keba et al. ................. 375/373

* cited by examiner

*Primary Examiner*—Stephen Chin
*Assistant Examiner*—Harry Vartanian
(74) *Attorney, Agent, or Firm*—Grossman & Flight, LLC

(57) ABSTRACT

A digital filter includes a number of coefficient generators that are clocked by a clock having a frequency including an undesired component. The coefficient generators, which each have a number of states, are communicatively coupled to multipliers that receive incoming signals and multiply the incoming signals by coefficients produced by the coefficient generators. Based on the magnitude of the undesired coefficient, certain states of the coefficient generators may be repeated or skipped to adjust the time and frequency domain of the output from the digital filter.

27 Claims, 9 Drawing Sheets

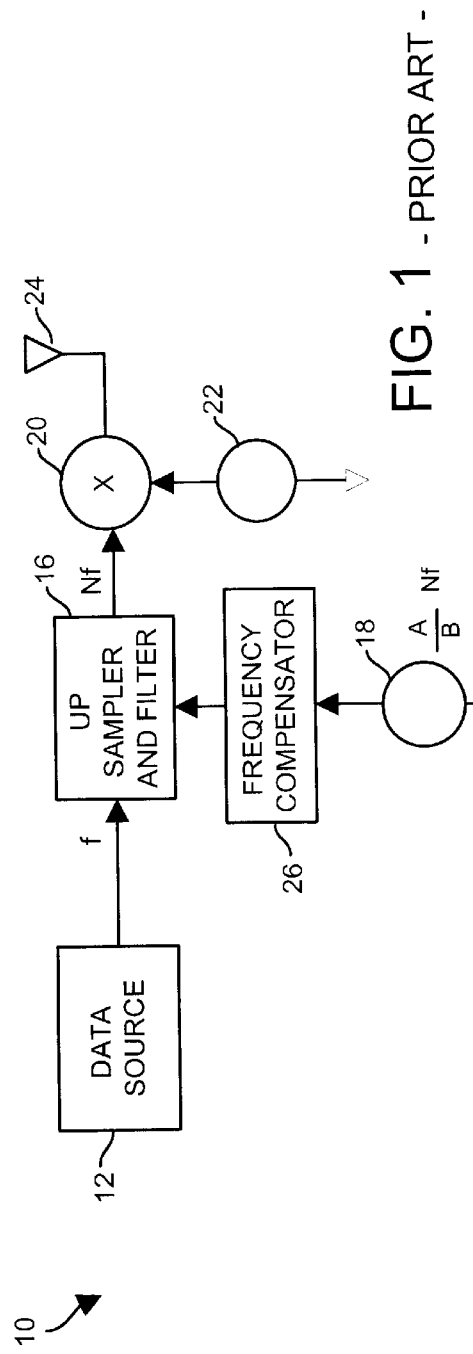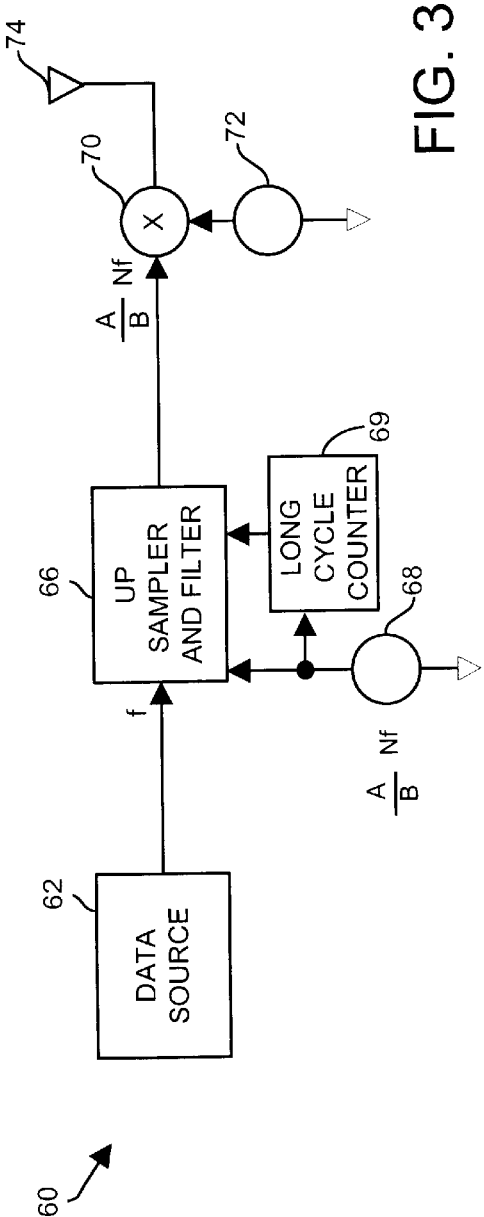
FIG. 1 - PRIOR ART -
FIG. 3

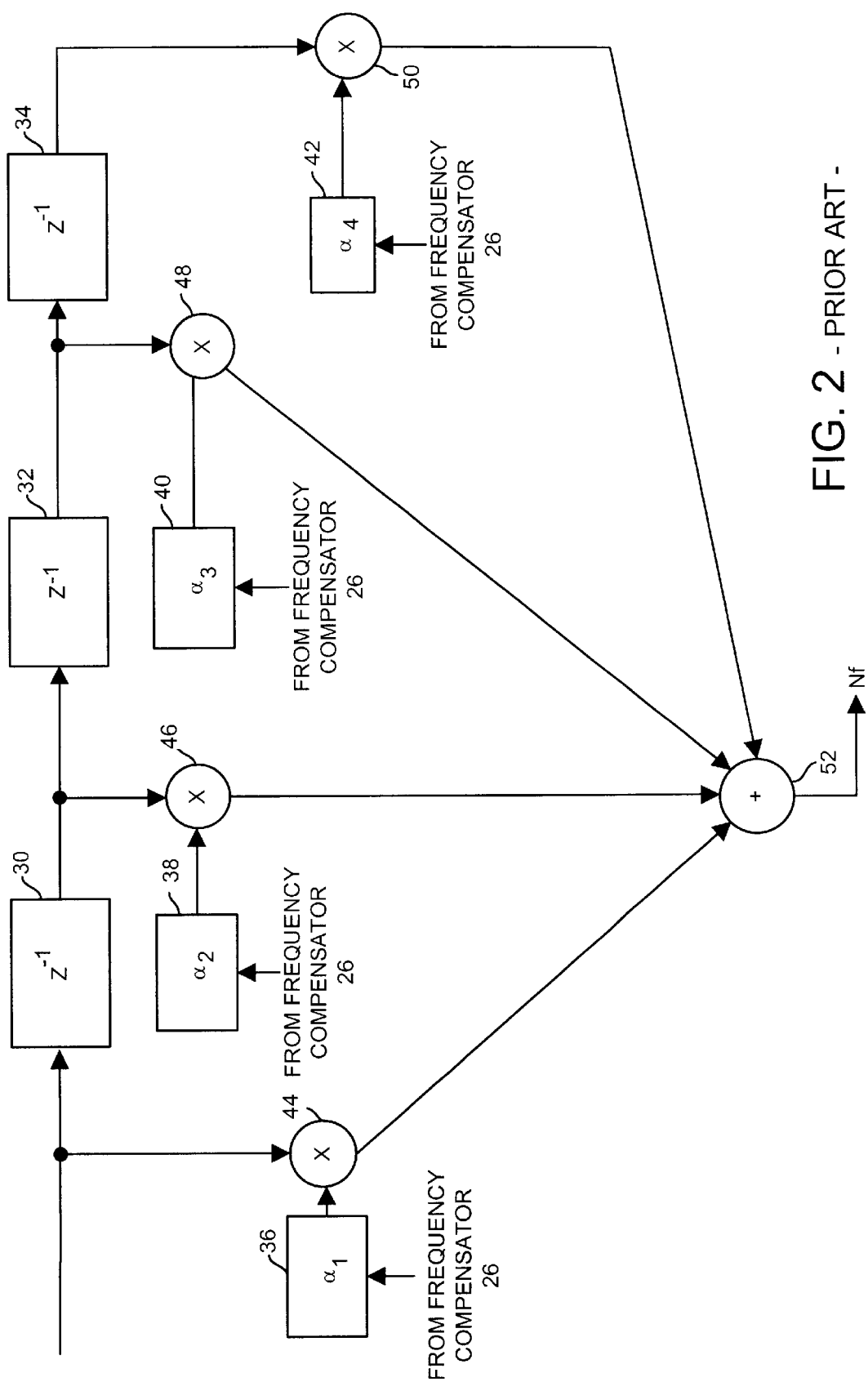
FIG. 2 - PRIOR ART -

| Long Cycle Counter State | α1 | Memory 1 | α2 | Memory 2 | α3 | Memory 3 | α4 | Memory 4 |
|---|---|---|---|---|---|---|---|---|
| 1023 | 0 | x3 | 0 | x2 | 0 | x1 | 0 | x0 |
| 1024 | 1 | x3 | 1 | x2 | 1 | x1 | 1 | x0 |
| 1025 | 2 | x3 | 2 | x2 | 2 | x1 | 2 | x0 |
| 1 | 3 | x3 | 3 | x2 | 3 | x1 | 3 | x0 |
| 2 | 3 | hold/x3 | 0 | x3 | 0 | x2 | 0 | x1 |
| 3 | 0 | x4 | 1 | x3 | 1 | x2 | 1 | x1 |
| 4 | 1 | x4 | 2 | x3 | 2 | x2 | 2 | x1 |
| 5 | 2 | x4 | 3 | x3 | 3 | x2 | 3 | x1 |
| 6 | 3 | x4 | 3 | hold/x3 | 0 | x3 | 0 | x2 |
| 7 | 0 | x5 | 0 | x4 | 1 | x3 | 1 | x2 |
| 8 | 1 | x5 | 1 | x4 | 2 | x3 | 2 | x2 |
| 9 | 2 | x5 | 2 | x4 | 3 | x3 | 3 | x2 |
| 10 | 3 | x5 | 3 | x4 | 3 | hold/x3 | 0 | x3 |
| 11 | 0 | x6 | 0 | x5 | 0 | x4 | 1 | x3 |
| 12 | 1 | x6 | 1 | x5 | 1 | x4 | 2 | x3 |
| 13 | 2 | x6 | 2 | x5 | 2 | x4 | 3 | x3 |
| 14 | 3 | x6 | 3 | x5 | 3 | x4 | 3 | hold/x3 |
| 15 | 0 | x7 | 0 | x6 | 0 | x5 | 0 | x4 |
| 16 | 1 | x7 | 1 | x6 | 1 | x5 | 1 | x4 |

FIG. 6

| Long Cycle Counter State | α1 | Memory 1 | α2 | Memory 2 | α3 | Memory 3 | α4 | Memory 4 |
|---|---|---|---|---|---|---|---|---|
| 1023 | 0 | x3 | 0 | x2 | 0 | x1 | 0 | x0 |
| 1024 | 1 | x3 | 1 | x2 | 1 | x1 | 1 | x0 |
| 1 | 2 | x3 | 2 | x2 | 2 | x1 | 2 | x0 |
| 2 | 3 | x3 | 3 | x2 | 3 | x1 | 0 | x1 |
| 3 | 0 | x4 | 0 | x3 | 0 | x2 | 1 | x1 |
| 4 | 1 | x4 | 1 | x3 | 1 | x2 | 2 | x1 |
| 5 | 2 | x4 | 2 | x3 | 2 | x2 | 3 | x1 |
| 6 | 3 | x4 | 3 | x3 | 0 | x3 | 0 | x2 |
| 7 | 0 | x5 | 0 | x4 | 1 | x3 | 1 | x2 |
| 8 | 1 | x5 | 1 | x4 | 2 | x3 | 2 | x2 |
| 9 | 2 | x5 | 2 | x4 | 3 | x3 | 3 | x2 |
| 10 | 3 | x5 | 0 | x5 | 0 | x4 | 0 | x3 |
| 11 | 0 | x6 | 1 | x5 | 1 | x4 | 1 | x3 |
| 12 | 1 | x6 | 2 | x5 | 2 | x4 | 2 | x3 |
| 13 | 2 | x6 | 3 | x5 | 3 | x4 | 3 | x3 |
| 14 | 0 | x7 | 0 | x6 | 0 | x5 | 0 | x4 |
| 15 | 1 | x7 | 1 | x6 | 1 | x5 | 1 | x4 |
| 16 | 2 | x7 | 2 | x6 | 2 | x5 | 2 | x4 |
| 17 | 3 | x7 | 3 | x6 | 3 | x5 | 3 | x4 |

DIGITAL FILTER HAVING AN UPSAMPLER OPERATIONAL AT A FRACTIONAL CLOCK RATE

TECHNICAL FIELD

The present invention is directed to digital filters and, more particularly, to a digital filter having an upsampler operational at a fractional clock rate.

BACKGROUND ART

Communication systems such as, for example, time-division multiple-access (TDMA) or code-division multiple-access (CDMA) systems, typically include a mobile unit and infrastructure. The mobile unit, which is typically referred to as a handset, a mobile phone, a portable phone, a car phone, a cellular phone or the like, and the infrastructure exchange information to provide voice and/or data communications therebetween. Such information may be in the form of digital information such as bits or bytes. Accordingly, both the mobile unit and the infrastructure include both a transmit path for sending information and a receive path for receiving information. Such receive and transmit paths include various signal processing, reception and transmission hardware. In digital communication systems, it is common for both the transmit and receive paths of the mobile unit of the infrastructure to include one or more digital filters.

Referring now to FIG. 1, a known transmit path 10, such as may be used in a mobile unit of a digital communications system, include a data source 12, an upsampler and filter 16 and a clock generator (or clock) 18. The data source 12 may be a voice coder or any other suitable hardware and/or hardware and software combination that generates a digital signal, or data stream that may include one or more bits. In the transmit path 10 of the mobile unit, the data source may include a number of functions. For example, the data source 12 may include a microphone into which the user speaks, a voice coder for processing the signal from the microphone into a digital signal and a CDMA spreader, which applies a pseudo-random number (PN) code to the output of the CDMA spreader.

The digital signal from the data source 12 has an associated data bit frequency, which may also be referred to as a bit rate, generally referred t hereinafter as f. In some applications, f may be a frequency such as 1.2288 megahertz (MHz). The digital signal is coupled to the upsampler and filter 16, which upsamples and filters the digital signal in a known manner described in conjunction with FIG. 2. After the digital signal is upsampled and filtered, it may be coupled from the upsampler and filter 16 to a mixer 20, which may also be referred to as an upconverter. The mixer 20 also receives a signal from an oscillator 22 and, using the oscillator signal, upconverts the upsampled digital signal to a frequency that is appropriate for transmission by an antenna 24.

Commonly, the clock 18 operates at a frequency that is an integral multiple of the data bit frequency (f). Accordingly, the clock frequency may be referred to as having a frequency of Nf, wherein N is an integer. When the upsampler and filter 16 receives a clock signal having a frequency equivalent to Nf, the upsampler and filter 16 operates in a known manner to produce an upsampled bit stream having a frequency of Nf However, in instances when the clock frequency is not an integral multiple of the frequency of the digital signal from the data source 12, a frequency compensator 26 is typically used. In particular, as shown in FIG. 1, if the clock frequency is (A/B)Nf, and (A/B) is a coefficient representing an undesired component of the clock frequency, the frequency compensator will typically remove B minus A clock cycles once every B cycles to generate a resultant frequency approximating an integer multiple of f (e.g., Nf). The inaccuracy between the resultant frequency approximating an integral multiple of f and the actual integral multiple of f is referred to hereinafter as clock jitter.

Turning now to FIG. 2, the upsampler and filter 16 includes a number of delay blocks 30, 32, 34 and a number of coefficient generators 36, 38, 40, 42, which are labeled as α1–α4, respectively. Each of the coefficient generators 36, 38, 40 42 is driven by the signal from the frequency compensator 26 and produces a different coefficient on each clock cycle output by the frequency compensator 26. Because the coefficient generators 36, 38, 40, 42 receive a signal from the frequency compensator 26 having a frequency of approximately Nf (due to the removal of one or more clock cycles), each coefficient generator produces N coefficients for each bit in the digital signal. The coefficient generators 36, 38, 40, 42 are coupled to multipliers 44, 46, 48, 50, which multiply the portions of the coded bit stream by the coefficients produced by the coefficient generators 36, 38, 40, 42. An adder 52 is coupled to each multiplier 44, 46, 48, 50 and sums the products of the multipliers 44, 46, 48, 50 together to produce the upsampled bit stream that is the filter output. Accordingly, the output of the adder 52 is an upsampled bit stream having a frequency of Nf.

There are, however, shortcomings associated with using a frequency compensator 26. For example, an oscillator having a frequency of 19.68 MHz may be the closest oscillator to an integral multiple of 1.2288 MHz, even though 19.68*(1024/1025)=16*1.2288 (i.e., the available 19.68 MHz oscillator is off by a factor of 1024/1025 from being an integral multiple of 1.2288 MHz). In such a situation, the known technique, employed by the frequency compensator 26, of generating an integral multiple of the digital signal frequency by removing one clock pulse out of every 1025 clock pulses of the 19.68 MHz oscillator may not produce an upsampler and filter output having an accurate representation of a signal having an exact clock frequency, due to jitter in the clock signal. The maximum clock jitter in such an arrangement may be +/−6.24%. Accordingly, removing one or more clock pulses by the frequency compensator 26 causes the frequency spectrum of the output signal from the upsampler and filter 16 to be spread due to the clock jitter.

SUMMARY OF THE INVENTION

The invention disclosed herein allows an oscillator having an output signal that is not an integral multiple of a data bit frequency to be used by an upsampler and filter, while reducing the inaccuracies in the time and frequency domains of the upsampler and filter output that are typically associated with an upsampler and filter using a frequency that is not an integral multiple of the data bit frequency.

In one aspect, the present invention may be embodied in a filter for use in a digital communication system having a data source producing a data stream having a first frequency, a first portion and a second portion. The digital communication system may further include a clock generator producing a signal having a second frequency that is equivalent to the first frequency multiplied by a desired coefficient and multiplied by an undesired coefficient. In such an arrangement the filter may include a first cycle counter communicatively coupled to the clock generator and producing a first periodic counting pattern having a number of states sequentially advanced by the clock generator, wherein the first cycle counter alters the first periodic counting pattern based on the undesired coefficient, a first coefficient table communicatively coupled to the first cycle counter and producing coefficients corresponding to the first periodic counting pattern and a first multiplier communicatively coupled to the first coefficient table and multiplying the first portion and the coefficients corresponding to the first periodic counting pattern to produce a first product signal. Additionally, the filter may include a second cycle counter communicatively coupled to the clock generator and producing a second periodic counting pattern having a number of states sequentially advanced by the clock generator, wherein the second cycle counter alters the second periodic counting pattern based on the undesired coefficient, a second coefficient table communicatively coupled to the second cycle counter and producing coefficients corresponding to the second periodic counting pattern and a second multiplier communicatively coupled to the second coefficient table and multiplying the second portion and the coefficients corresponding to the second periodic counting pattern to produce a second product signal. The filter may also include an adder adding the first product signal to the second product signal to produce an output of the filter.

In the foregoing embodiment, the undesired coefficient may be equivalent to a first integer divided by a second integer and wherein the first cycle counter alters the first periodic counting pattern by repeating a number of states when the first integer is larger than the second integer. Further, the number of states that are repeated per a number of states equal to the first integer may be determined by the difference between the first integer and the second integer and the number of times a state is repeated per a number of states equal to the first integer is equal to an integer part of a quotient of the first integer divided by the second integer.

Additionally, the undesired coefficient may be equivalent to a first integer divided by a second integer and the first cycle counter alters the first periodic counting pattern by skipping a number of states when the first integer is smaller than the second integer. Also, the number of states that are skipped per a number of states equal to the first integer may be determined by the difference between the second integer and the first integer. Further, the number of times a state is repeated per a number of states equal to the first integer is equal to an integer part of a quotient of the second integer divided by the first integer.

In the foregoing embodiment, the first cycle counter alters the first periodic counting pattern before the second cycle counter alters the second periodic counting pattern and wherein the first cycle counter alters the first periodic counting pattern after the second cycle counter alters the second periodic counting pattern.

According to a second aspect, the present invention may be embodied in a filter for use in a digital communication system having a data source producing a data stream having a first frequency, a first portion and a second portion, the digital communication system further having a clock generator producing a signal having a second frequency that is equivalent to the first frequency multiplied by a desired coefficient and multiplied by an undesired coefficient. In such an arrangement, the filter may include a first memory element storing the first portion and a second memory element storing the second portion. The filter may also include a first coefficient generator communicatively coupled to the clock generator and periodically producing a first pattern of coefficients having a number of states sequentially advanced by the clock generator, wherein the first coefficient generator alters the first pattern of coefficients based on the undesired coefficient and a first multiplier communicatively coupled to the first coefficient generator and the first memory element, the first Multiplier multiplying the first portion and the first pattern of coefficients to produce a first product signal. Additionally, the filter may include a second coefficient generator communicatively coupled to the clock generator and periodically producing a second pattern of coefficients having a number of states sequentially advanced by the clock generator, wherein the second coefficient generator alters the second pattern of coefficients based on the undesired coefficient corresponding to the second periodic counting pattern and a second multiplier communicatively coupled to the second coefficient generator and the second memory element, the second multiplier multiplying the second portion and the second pattern of coefficients to produce a second product signal. Further, the filter may also include an adder adding the first product signal to the second product signal to produce an output of the filter.

According to a third aspect, the present invention may be embodied in a filtering method for use in a digital communication system having a data source producing a data stream having a first frequency, a first portion and a second portion, the digital communication system further having a clock generator producing a signal having a second frequency that is equivalent to the first frequency multiplied by a desired coefficient and multiplied by an undesired coefficient. The filtering method may include the steps of producing a first periodic counting pattern having a number of states sequentially advanced by the clock generator, altering the first periodic counting pattern based on the undesired coefficient, producing coefficients corresponding to the first periodic counting pattern and multiplying the first portion and the coefficients corresponding to the first periodic counting pattern to produce a first product signal. The method may also include the steps of producing a second periodic counting pattern having a number of states sequentially, advanced by the clock generator, altering the second periodic counting pattern based on the undesired coefficient, producing coefficients corresponding to the second periodic counting pattern and multiplying the second portion and the coefficients corresponding to the second periodic counting pattern to produce a second product signal. Further, the method may include the step of adding the first product signal to the second product signal to produce an output of the filter.

These and other features of the present invention will be apparent to those of ordinary skill in the art in view of the description of the preferred embodiments, which is made with reference to the drawings, a brief description of which is provided below.

BRIEF DESCRIPTION OF THE DRAWINGS

FIG. 1 is a block diagram of a prior art system having a known upsampler and filter and a frequency compensator that alters a non-integer multiple clock to approximate an integer multiple clock;

FIG. 2 is a block diagram of the prior art upsampler and filter of FIG. 1;

FIG. 3 is a block diagram of an upsampler and filter adapted to operate using a clock that is not an integral multiple of the data bit frequency;

FIG. 6 is a chart illustrating exemplary operation of the upsampler and filter of FIG. 4 showing various repeated states of the coefficient generators;

FIG. 7 is a chart illustrating exemplary operation of the upsampler and filter of FIG. 4 showing various skipped states of the coefficient generators;

DESCRIPTION OF THE PREFERRED EMBODIMENTS

Figure 4:
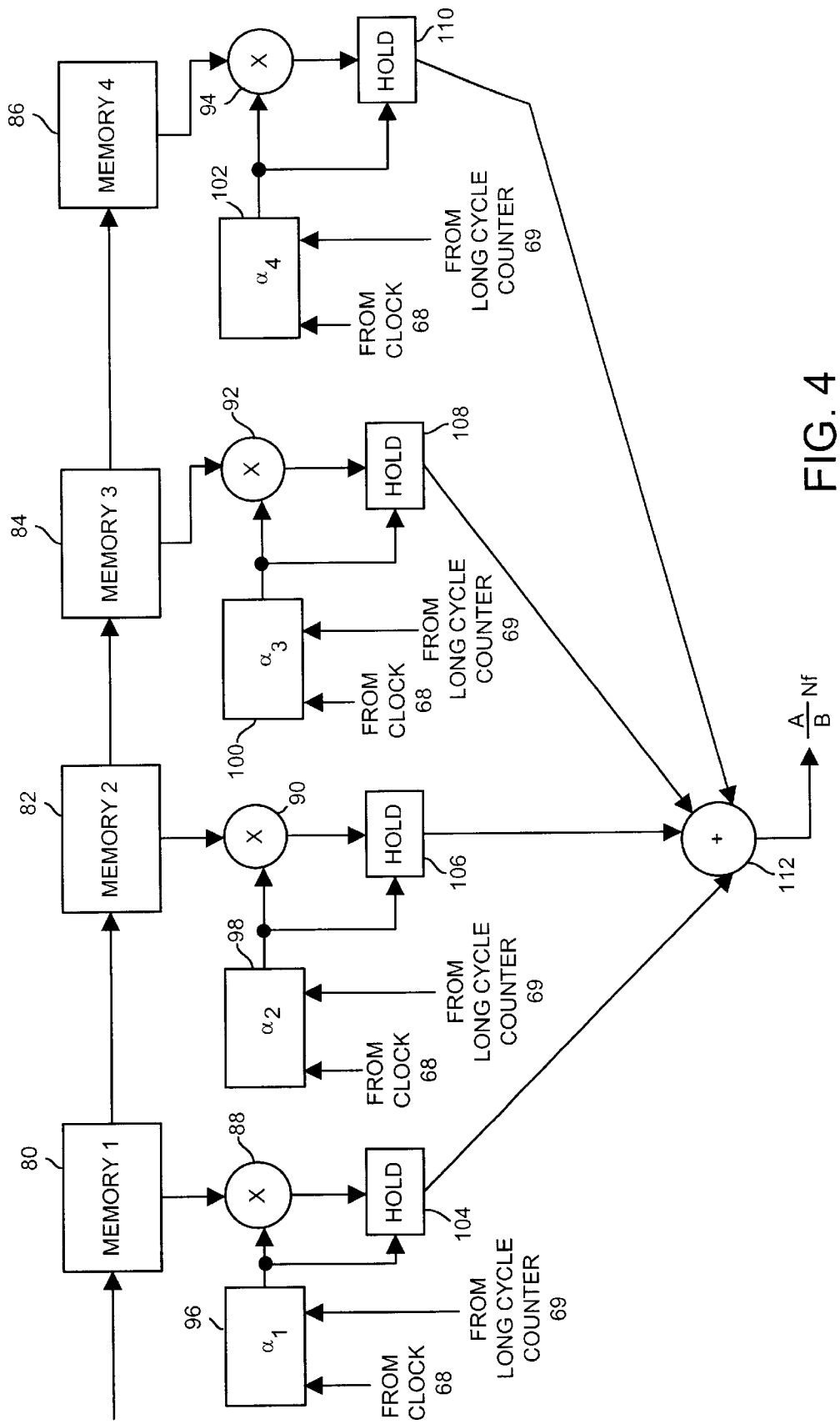
FIG. 4 is a detailed block diagram of the upsampler and filter of FIG. 3.

The invention described herein contemplates an upsampler and filter (also referred to herein as a "filter") that may be driven by an oscillator having a frequency that is not an integral multiple of a data bit frequency. Such an upsampler and filter reduces the inaccuracies in the time and frequency domain of the upsampler and filter output that are typically associated with an upsampler and filter using a frequency that is not an integral multiple of the data bit frequency. Conceptually, the oscillator frequency may be thought of as the data bit frequency (f) multiplied by a desired coefficient (N) and an undesired coefficient (A/B). The undesired coefficient is typically, but not necessarily, a number between zero and 2 and is the component of the oscillator frequency for which the upsampler and filter must compensate.

The upsampler and filter compensates for the undesired coefficient by spreading the undesired coefficient over all of the multiplication products of the upsampler and filter. The undesired coefficient is spread either by repeating a coefficient or skipping a coefficient on each of the taps of the upsampler and filter, depending on whether the undesired coefficient is greater or less than one. For example, if the undesired coefficient, which may be the quotient of two scalar numbers. (A/B), is 1025/1024 (i.e., greater than one), certain ones of the coefficients produced by the coefficient generator may be repeated because the coefficients need only transition 1024 times in 1025 opportunities to transition. Alternatively, if the undesired coefficient is 1024/1025 (i.e., less than one), certain ones of the coefficients produced by the coefficient generator may be skipped because the coefficients need to transition 1025 times over 1024 opportunities. The description of the hardware and/or software that may be used to implement these concepts are described hereinafter.

Turning now to the figures, FIG. 3 illustrates a transmit path 60 including a data source 62 and an upsampler and filter 66 that receives input from a clock 68. The transmit path 60 may be used in, for example, a mobile unit that communicates with infrastructure. However, it should be understood that such a use is merely exemplary. A long cycle counter 69 also receives input from the clock 68 and produces an output that is coupled to the upsampler and filter 66. Further detail regarding the operation of the long cycle counter 69 will be provided in conjunction with the description of FIG. 5. In certain applications, the upsampler and filter 66 may be communicatively coupled to a mixer 70, which may receive a signal from an oscillator 72 and may couple an output signal to an antenna 74. However, such an application is merely an exemplary application of the upsampler and filter 66.

Some of the components shown in the transmit path 60 of FIG. 3 may be substantially equivalent to the components shown in the known transmit path 10 of FIG. 1. However, one substantial difference between the two transmit paths 10 and 60 is the fact that the upsampler and filter 66 shown in FIG. 3 is adapted to receive a signal from the clock 68 having a frequency that is not an integer multiple (or an approximation thereof) of the data bit frequency (f) and that the output of the upsampler and filter 66 has an accurate representation of an ideal output signal in the time and frequency domains. Detail regarding the operation of the upsampler and filter 66 is provided below with regard to FIGS. 4–10.

As noted above, another difference between the transmit paths 10 and 60 is that the clock 68 produces a signal having a frequency equivalent to the data bit frequency (f) multiplied by a desired coefficient (N) and further multiplied by an undesired coefficient (A/B): The undesired coefficient is used to represent the fact that available oscillators used by an upsampler and filter may not always be integral multiples of the data bit frequency (f). For example, A may be equal to 1024 and B may be equal to 1025 or A may be equal to 1025 and B may be equal to 1024. These two examples will be used hereinafter to illustrate the operation of the upsampler and filter 66. However, such examples are merely illustrative of the operation of the upsampler and filter 66.

As shown in FIG. 4, the upsampler and filter 66 may include a number of memory elements 80, 82, 84, 86 that may be used to shift and hold portions of the data stream that is output from the data source 62. Such portions of the data stream may be one or more bits in length. Conceptually, as represented in FIG. 4, portions of the data stream on the left hand side, or input, of a particular memory element are delayed in time, or later than, portions of the bit stream on the right hand side, or output side, of that memory element.

The memory elements 80, 82, 84, 86 are coupled to multipliers 88, 90, 92, 94, respectively. Coefficient generators 96, 98, 100, 102 are also coupled to the multipliers 88, 90, 92, 94 respectively. Each of the coefficient generators 96, 98, 100, 102 is coupled to, and is clocked by, the clock 68, which has a frequency equivalent to the data bit rate (f) multiplied by a desired coefficient (N) and multiplied by an undesired coefficient (A/B). As the coefficient generators 96, 98, 100, 102 receive pulses from the clock 68, the coefficient generators 96, 98, 100, 102 periodically produce patterns of coefficients having a number of states that are sequentially advanced by the clock 68. Each multiplier 88, 90, 92, 94 may be coupled to a hold block 104, 106, 108, 110 each of which may be controlled by its respective coefficient generator 96, 98, 100, 102. The hold blocks 104, 106, 108, 110 are optional and may be used either to hold multiplication products previously generated by the multipliers 88, 90, 92, 94 or to merely couple information from the multipliers 88, 90, 92, 94 without storing previously generated products. The functionality of the hold blocks 104, 106 108, 110 will be more fully described in connection with FIG. 6 described hereinafter. The hold blocks 104, 106, 108, 110 are all coupled to an adder 112, which sums the outputs of the hold blocks 104, 106, 108, 110 to produce the upsampler and filter output that may be coupled to the mixer 70 (FIG. 3). If the hold blocks 104, 106, 108, 110 are not provided, the output signals from the multipliers 88, 90, 92, 94 would be coupled directly to the adder 112.

During operation, the memory elements 80, 82, 84, 86 store portions of the data stream from the data source 62.

The stored portions of the data stream, which may be one or more bits, are multiplied by the coefficients produced by the coefficient generators 96, 98, 100, 102 using the multipliers 88, 90, 92, 94, and the products of the multiplications are summed by the adder 112. Of particular interest is the functionality of the coefficient generators 96, 98, 100, 102 that produce the coefficients by which the portions of the bits stream are multiplied. While typical coefficient generators (e.g., the coefficient generators 36, 38, 40, 42 shown in FIG. 2) produce periodic coefficients (e.g., in a system having four coefficients, a typical coefficient generator would produce the periodic sequence of coefficients represented by $\alpha_1=0, 1, 2, 3, 0, 1, \ldots$ ), the coefficient generators 96, 98, 100, 102 of the upsampler and filter 66 have the ability to repeat or skip coefficients depending on the value of the undesired coefficient (A/B). For example, if A is greater than B, the coefficient generators 96, 98, 100, 102 will repeat a particular coefficient A minus B times every A cycles of the clock 68. Alternatively, if A is less than B, the coefficient generators 96, 98, 100, 102 will skip a particular coefficient B minus A times every A cycles of the clock 68. Further detail regarding the operation and structure of the coefficient generators 96, 98, 100, 102 will be provided below with respect to FIGS. 5–7.

Although the arrangement shown in FIG. 4 has four taps and the coefficient generators 96, 98, 100, 102 have been described as being adapted to produce four different coefficients, those having ordinary skill in the art will readily recognize that any desired number of taps and coefficients may be used. Similarly, while the following description pertains to a four tap, four times oversampling structure, one having ordinary skill in the art will readily recognize that more or fewer taps and more or fewer times oversampling may be used.

Figure 5:
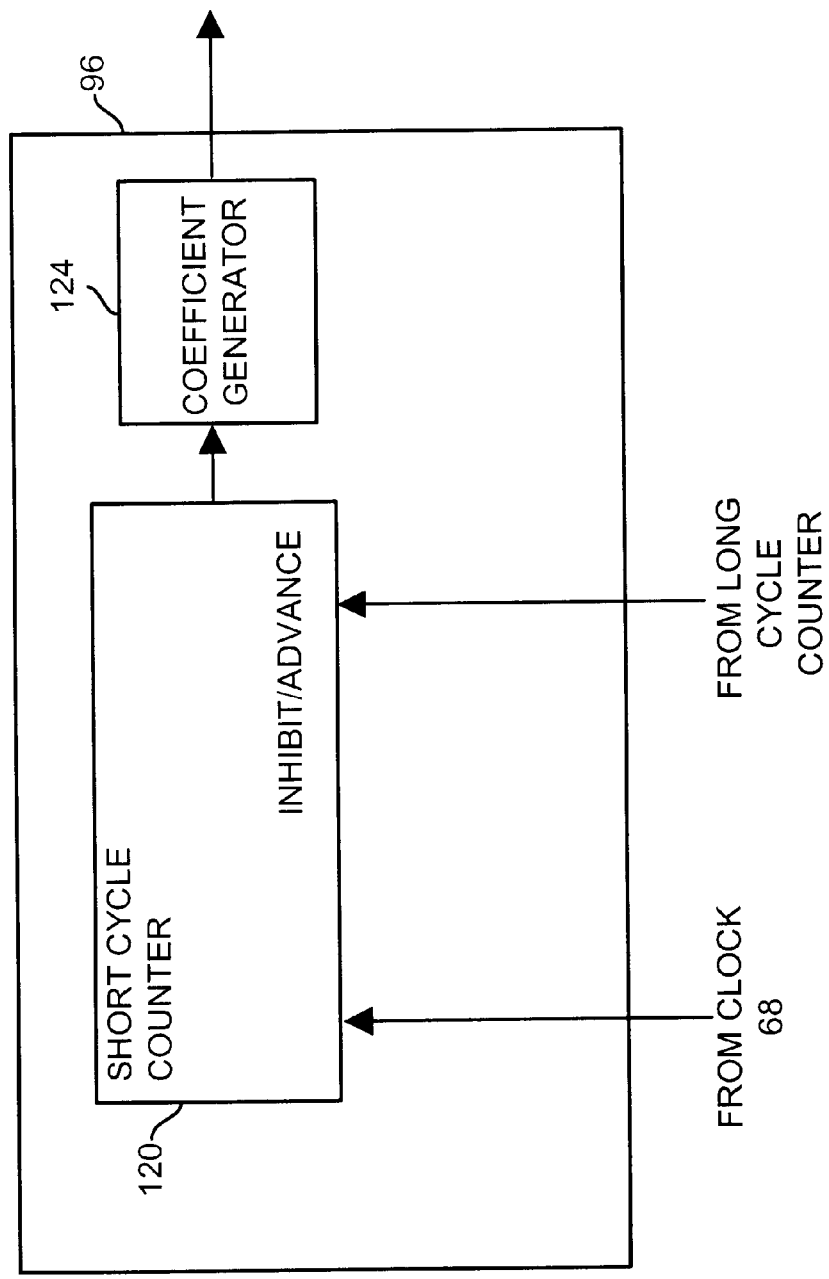
FIG. 5 is a detailed block diagram of the coefficient generator of FIG. 4.

As shown in FIG. 5, a coefficient generator (e.g., the coefficient generator 96) includes a short cycle counter 120 and a coefficient table 124, wherein the clock 68 and the long cycle counter 69 are coupled to the short cycle counter 120. During operation, the short cycle counter 120 produces a counting pattern having a number of states that are sequentially advanced by pulses from the clock 68. The counting pattern is periodic and begins at zero and counts to three before looping back around to zero. Because the system described herein uses four times oversampling, the short cycle counter 120 only counts from zero to three. However, in systems having more or fewer than four times over sampling, the short cycle counter 120 may be set to count from zero to a number that is one less than the desired oversampling. Although the short cycle counter 120 is described herein as beginning its count at zero, those having ordinary skill in the art will readily recognize that the short cycle counter 120 may begin its count at one without deviating from the scope of the present invention.

The count of the short cycle counter 120 is coupled to the coefficient table 124, which outputs coefficients based on the count of the short cycle counter 120. For example, as the short cycle counter 120 counts from 0 to 3, the coefficient table 124 may output coefficients 0, 1, 2, 3, respectively. While the coefficients generated by the coefficient generator 96 and the coefficient table 124 are referred to as 0–3, those having ordinary skill in the art will readily recognize that the numbers 0–3 merely represent four states that actual coefficients may have. Coefficients corresponding to such states may be empirically determined or determined through any known or desired algorithm.

The long cycle counter 69 increments its count each time it receives a pulse from the clock 68. During operation, the long cycle counter 69 counts, in a periodic counting pattern, from 1 to a number equivalent to A (the numerator of the undesired coefficient). After the long cycle counter, 69 reaches the count of A, the long cycle counter 69 increments to a count of 1 on the next pulse generated by the clock 68. Although the long cycle counter 69 is described herein as counting between 1 and A, those having ordinary skill in the art will readily recognize that the long cycle counter 69 may count between other numbers, such as between 0 and A−1 without deviating from the scope of the present invention. The long cycle counter 69 is coupled to the short cycle counter 120 and has the ability to inhibit or advance the count of the short cycle counter 120. If the long cycle counter 69 inhibits the short cycle counter 120, the output count of the short cycle counter 120 will not change when the short cycle counter 120 receives a pulse from the clock 68. For example, if the short cycle counter 120 output is currently 2 and would change to 3 on the next pulse of the clock 68 and the long cycle counter 69 is inhibiting the short cycle counter 120, the output of the short cycle counter 120 will still be 2 after the short cycle counter 120 receives the next pulse from the clock 68. Accordingly, the short cycle counter 120 alters its periodic counting pattern based on the undesired coefficient.

Conversely, if the long cycle counter 69 advances the short cycle counter 120, the output count of the short cycle counter 120 will increment two or more times on the next pulse from the clock 68. For example, if the short cycle counter 120 output is currently 2 and would change to 3 on the next pulse of the clock 68 and the long cycle counter 69 is advancing the short cycle counter 120, the output of the short cycle counter 120 will be 0 (skipping from 3 to 0) when the short cycle counter 120 receives the next pulse from the clock 68. In practice, the long cycle counter 69 may inhibit or advance the short cycle counter 120 by providing signals thereto. The states of such signals or the data contained in the signals may be used to inhibit or advance the short cycle counter 120.

The ability to inhibit or advance the short cycle counter 120 and thereby make the short cycle counter 120 repeat its output or skip past an output, enables the coefficients output from the coefficient table 124 to be repeated and/or skipped. The ability to repeat or skip a coefficient is useful when using clocks, such as the clock 68, having output frequencies that are not integral multiples of the data bit frequency (f). Accordingly, an undesired coefficient (e.g., A/B) may be compensated for through the use of the inhibit and the advance functions. In particular, when A is greater than B, the repeat or inhibit function may be used and when A is less than B the skip or advance function may be used.

When the undesired coefficient is greater than one (i.e., A is greater than B), a number of coefficients must be repeated. The number of coefficients that must be repeated and the number of times they must be repeated may be calculated according to equations 1–4.

| | |
|---|---|
| low repetition rate=$A$ $DIV$ $B-1$ | Equation 1 |
| high repetition rate=$(A$ $DIV$ $B)$ | Equation 2 |
| number of high rate repetitions per $A=A$ $MOD$ $B$ | Equation 3 |
| number of low rate repetitions per $A=B-(A$ $MOD$ $B)$ | Equation 4 |

For example, if A=1025 and B=1024, the low repetition rate would be 0 (i.e., no repetitions at all), the high repetition rate would be 1, the number of high rate repetitions per A clock cycles would be 1 and the number of low rate repetitions per A clock cycles would be 1023. Accordingly, one coefficient state would be output two times in a row per long cycle counter cycle and all other coefficients would not be repeated during long cycle counter cycle.

By way of further example, reference is now made to a chart shown in FIG. 6, which includes a long cycle counter state column 150, first, second, third and fourth coefficient generator state columns 152, 154, 156, 158 and first, second, third and fourth memory state columns 160, 162, 164, 166. The various rows of the chart correspond to the states of the memories and the coefficient generators at particular long cycle counter states, it being understood that the long cycle counter counts in a periodic counting pattern from 1 to 1025 before looping back to 1 again. For example, at long cycle counter state of 1025, the coefficient generators 1–4 output their third coefficients and memories 1–4 contain x3, x2, x1 and x0, respectively, which represent the fourth, third, second and first portions of the data stream coupled to the upsampler and filter 66.

Of particular interest in FIG. 6 are the states of $\alpha 1, \alpha 2, \alpha 3$ and $\alpha 4$ at long cycle counter states 1–2, 5–6, 9–10 and 13–14. In particular, $\alpha 1$ repeats coefficient 3, the fourth coefficient of $\alpha 1$, for state 2 of the long cycle counter state. After coefficient 3 has-been repeated, $\alpha 1$ periodically cycles from coefficient 0 to coefficient 3 before looping back to coefficient 0. Accordingly, due to the periodic and repeating nature of coefficient 3 of $\alpha 1$, as shown in FIG. 6, the state of the coefficients for $\alpha 1$ only change or advance through 1024 states in 1025 clock cycles, which are counted by the long cycle counter 69 (FIG. 5). In practice, coefficient 3 of $\alpha 1$ is prevented from changing when the long cycle counter state transitions from state 1 to state 2 because the long cycle counter 69 inhibits the short cycle counter 120 from changing its state. Because the short cycle counter 120 does not change its state, the coefficient output by the coefficient table 124 does not change its state when the long cycle counter state transitions from state 1 to state 2.

As shown in FIG. 6, the long cycle counter having a state of 1 matches the $\alpha 1$ coefficient of 3 with the memory 1 content, x3. During the next clock cycle (i.e., when the long cycle counter state changes to a state of 2), the value of $\alpha 1$ does not change and the value of memory 1 may or may not change. In particular, as shown in FIG. 6 by hold/x3 in the memory 1 location for long cycle counter state 2, the product of the previous multiplication of $\alpha 1=3$ and memory 1=x3 may be held by the hold block 104, thereby eliminating a redundant recalculation of a product that was just previously calculated. The hold block 104 may be controlled to hold a particular multiplication product by the coefficient generator 96. For example, when two identical coefficients are output from the coefficient generator on subsequent clock cycles, the hold block 104 may hold a prior multiplication product.

While the foregoing description of FIG. 6 has focused on the $\alpha 1$ coefficients and the memory 1 contents, the same repetition of coefficients and holding of previously calculated products takes place with regard to coefficients $\alpha 2$–$\alpha 4$ and memories 2–4. That is, each of the coefficient generators repeats one of their coefficients one time over 1025 clock cycles and when that repetition takes place, the adder may use a previously calculated product that was held by one of the hold blocks 104, 106, 108, 110. As shown in FIG. 6, the coefficients are not repeated at the same time (i.e., the repetition of coefficients is staggered with respect to clock cycles, which are represented by the long cycle counter state). Further, while the coefficient generators are not aligned with one another (i.e., not all outputting the same coefficient on the same long cycle counter state) during long cycle counter states 2–14, the coefficient generators become aligned at the long cycle counter state 15 and remain aligned until the long cycle counter loops around to a state of 2.

While certain states of coefficients generators are shown as occurring for particular long cycle counter states in FIG. 6, it should be noted that FIG. 6 is merely representative of the states of the coefficient generators and memories during one exemplary and particular period of time. During subsequent periods of time, those particular long cycle counter states may have different coefficient generator states associated therewith because the coefficient generators are driven by the short cycle counters that periodically count from 0 to 3 before looping back to 0 again. Additionally, while the coefficient generators represented in FIG. 6 have four states (0–3), it will be understood by those having ordinary skill in the art that the coefficient generators may have more or fewer states. Furthermore, while the exemplary data shown in FIG. 6 reveals repeating a particular coefficient a single time, it should be recognized by those having ordinary skill in the art that one or more coefficients may be repeated one or more different times to reduce the number of transitions over a number of clock cycles. The number of times a coefficient must be repeated and the a number of times those repetitions must take place during a given number of clock cycles may be determined using equations 1–4.

The concept of repeating coefficients to create fewer coefficient transitions over a number of clock cycles was discussed in connection with FIG. 6. However, there are certain instances in which A is less than B (i.e., the undesired coefficient is less than one). In such instances, a larger number of coefficient generator transitions that clock cycles needs to occur. The number of coefficient generator transitions may be increased by the long cycle counter 69 advancing the short cycle counter 120, which, in turn, advances the coefficient output from the coefficient table 124. When the undesired coefficient is less than one, a number of coefficients must be skipped. The number of coefficients that must be skipped and the number of times they must be skipped may be calculated according to equations 5–8.

$$\text{low skip rate} = (B \; DIV \; A) - 1 \qquad \text{Equation 5}$$

$$\text{high skip rate} = B \; DIV \; A \qquad \text{Equation 6}$$

$$\text{number of high rate skips per } A = B \; MOD \; A \qquad \text{Equation 7}$$

$$\text{number of low rate skips per } A = B - (B \; MOD \; A) \qquad \text{Equation 8}$$

For example, if A=1024 and B=1025, the low skip rate would be 0 (i.e., no skips at all), the high skip rate would be 1 (i.e., skip one state), the number of high rate skips per A clock cycles would be 1 and the number of low rate skips per A clock cycles would be 1024. Accordingly, one coefficient state would be skipped per long cycle counter cycle and all other coefficients would not be skipped.

By way of further example, reference is now made to a chart shown in FIG. 7, which, like the chart of FIG. 6, includes a long cycle counter state column 170, first, second, third and fourth coefficient generator state columns 172, 174, 176, 178 and first, second, third and fourth memory state columns 180, 182, 184, 186. The various rows of the chart correspond to the states of the memories and the coefficient generators at a particular long cycle counter state, it being understood that the long cycle counter counts in a periodic counting pattern from 1 to 1024 before looping back to 1 again. For example, at long cycle counter state of 1024, the coefficient generators 1 4 are outputting their second coefficient (i.e., coefficient 1) and memories 1 4 contain x3, x2, x1 and x0, respectively, which represent the fourth, third, second and first portions of the data stream coupled to the upsampler and filter 66.

Of particular interest in FIG. 7 are the states of α1, α2, α3 and α4 at long cycle counter states 1–2, 5–6, 9–10 and 13–14. In particular, α4 repeats skips coefficient 3, the fourth coefficient of α4, for state 2 of the long cycle counter state. After coefficient 3 has been skipped, α4 periodically and repeatedly cycles from coefficient 0 to coefficient 3 before looping back to coefficient 0. Accordingly, due to the skipping of coefficient 3 of α4, as shown in FIG. 7, the state of the coefficients for α4 change or advance through 1025 states in 1024 clock cycles, which are counted by the long cycle counter 69. In practice, coefficient 3 of α4 is skipped when the long cycle counter state transitions from 1 to 2 because the long cycle counter 69 advances the short cycle counter 120. Because the short cycle counter 120 skips state 3, the coefficient output by the coefficient table 124 changes from 2 to 0 when the long cycle counter state transitions from 1 to 2.

While the foregoing description of FIG. 7 has focused on the α4 coefficients and the memory 4 contents, the same skipping of coefficients takes place with regard to coefficient generators (α1–α3) and memories 1–3. That is, each of the coefficient generators skips one of their coefficients one time over 1024 clock cycles. As shown in FIG. 7, none of the coefficients are skipped at the same time (i.e., the skipping of coefficients is staggered with respect to clock cycles, which are represented by the long cycle counter state). Further, while the coefficient generators are not aligned with one another (i.e., not all outputting the same coefficient on the same long cycle counter state) during long cycle counter states 2–14, the coefficient generators become aligned at the long cycle counter state 15 and remain aligned through long cycle counter state of 2.

While certain states of coefficients generators are shown as occurring for particular long cycle counter states in FIG. 7, it should be noted that FIG. 7 is merely representative of the states of the coefficient generators and memories during a particular period of time. During subsequent periods of time, those particular long cycle may have different coefficient generator states associated therewith because the coefficient generators repeatedly count from 0 to 3 before looping back to 0 again. Additionally, while the coefficient generators having states represented in FIG. 7 have four states (0–3), it will be understood by those having ordinary skill in the art that the coefficient generators may have more or fewer states. Furthermore, while the exemplary data shown in FIG. 7 reveals skipping a particular coefficient a single time, it should be recognized by those having ordinary skill in the art that one or more coefficients may be skipped one or more different times to increase the number of transitions over a number of clock cycles. The number of times a coefficient must be skipped and the number of times those skips must take place during a given number of clock cycles may be determined using equations 5–8.

Also, the location of the repetition or skip within a short count has been shown to be at the beginning or the end of the short cycle. This is not a requirement as any of the coefficients may be skipped or repeated. Likewise, while repetitions and skips have been shown sequentially from one coefficient counter to the next, this is not a requirement and the repetition or skipping of individual short counts may be distributed over the entire long count cycle.

Figure 8:
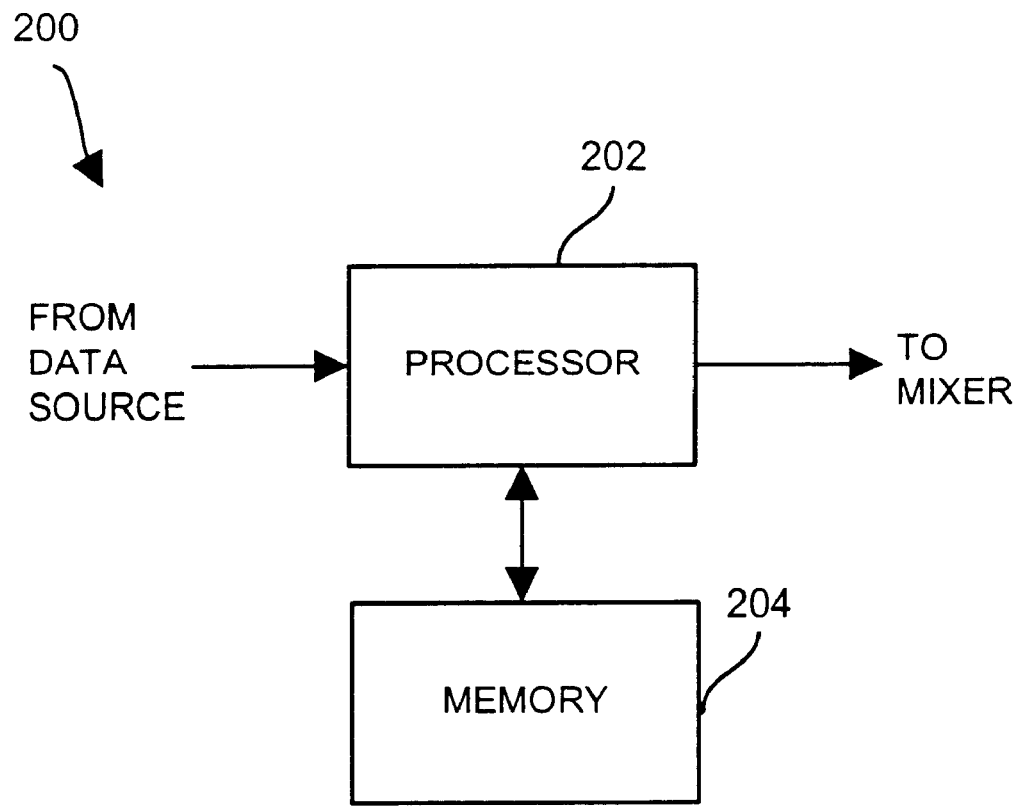
FIG. 8 is a block diagram of hardware that may be used in conjunction with software to implement the upsampler and filter of FIG. 3.

Referring to FIG. 8, hardware 200 on which software instructions implementing the concepts disclosed herein may be implemented includes a processor 202 and a memory 204. In practice, the processor 202 may be any suitable processing device such as a microprocessor or a digital signal processor (DSP). The memory 204 may be embodied in random access memory (RAM), read only memory (ROM) or any suitable combination thereof. Additionally, the memory 204 may be wholly or partially integrated with the processor 202. As shown in FIG. 8, the processor 202 receives an input signal and produces an output signal that may be coupled to the mixer 70 (FIG. 3).

In operation, the processor 202 executes software instructions that are stored in the memory 204. Such instructions may be written in a high level language such as C or any other suitable high level language, which may be compiled to run on the processor 202. Alternatively, the instructions may be written in assembly code, machine code or any other suitable form known to those having ordinary skill in the art.

Figure 9:
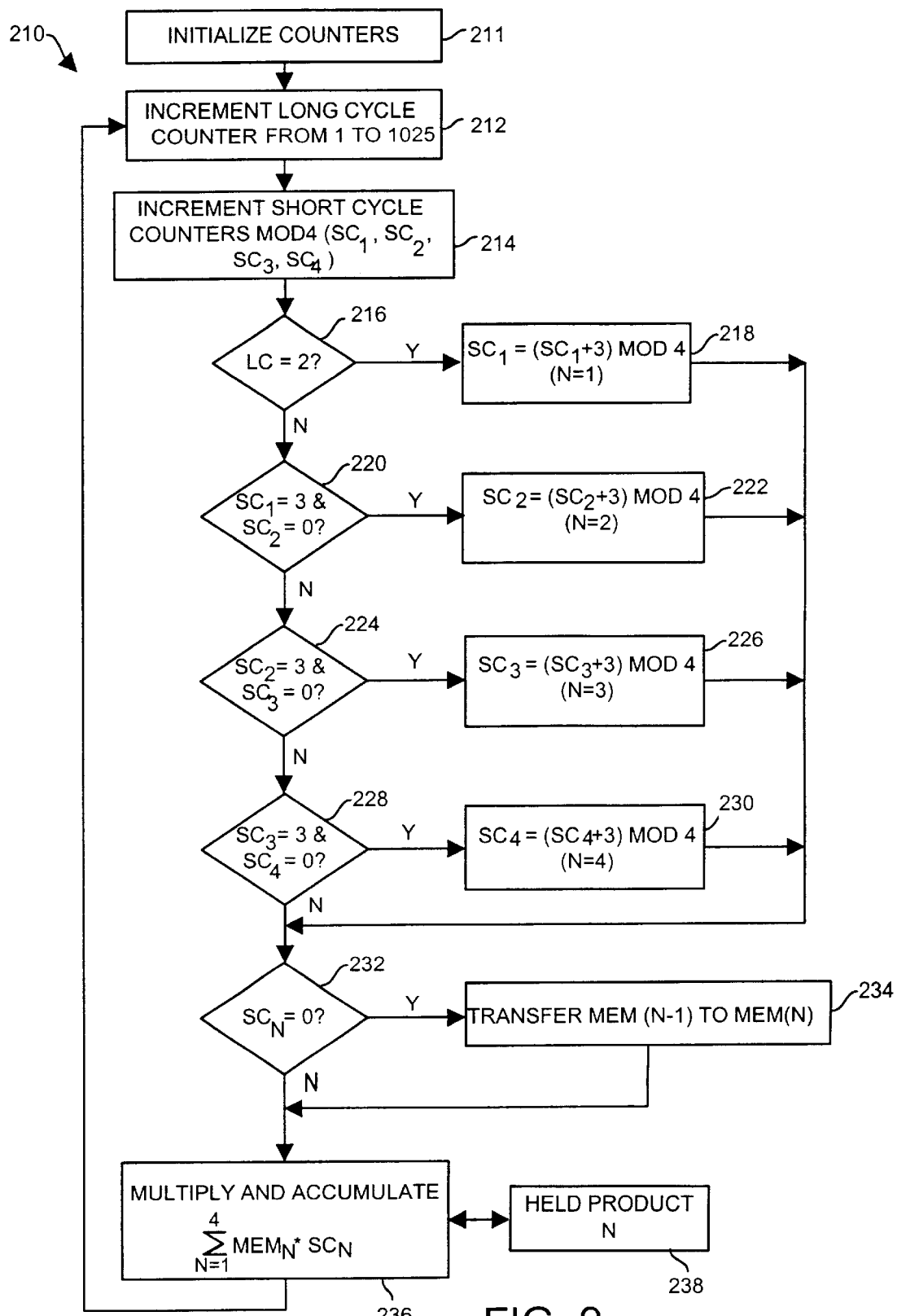
FIG. 9 is a flow diagram illustrating a process for repeating states of the coefficient generators to produce an output from the upsampler and filter of FIG. 3.

Referring now to FIG. 9, an upsampling and filtering process 210 for an undesired coefficient greater than one (e.g., 1025/1024) includes a number of blocks. The process 210 includes a long cycle counter (LC) and four short cycle counters ($SC_1$–$SC_4$). Additionally, the process uses a number of memory locations, which may be conceptually represented as shown in FIG. 4. For example the memory elements may be referred to as memory elements 1–4 and data may be transferred between the memory elements. The long cycle counter and the short cycle counter states may be stored in the memory 204.

Turning now to the operation of the process 210, at a block 211 the counters (both the long cycle counter and the short cycle counters) are initialized. After the counters are initialized, a block 212 increments the long cycle counter. As shown in the block 212, the long cycle counter increments from 1 to 1.025 before looping back to 1. After the long cycle counter is incremented by the block 212, a block 214 increments the short cycle counters ($SC_1$–$SC_4$) in MOD 4 fashion.

After the long cycle counter and the short cycle counters have been incremented, control passes to a block 216, which determines if the long cycle counter has a state of 2. If the long cycle counter has a state of 2, control passes to a block 218, which adds three to the first short cycle counter ($SC_1$) in MOD 4 fashion. Accordingly, the block 218 effectively decrements the first short cycle counter. For example, as shown in FIG. 6, α1 for a long cycle counter state of 2 would have been 0, but has been effectively decremented to 3 and, therefore, the remains the same as its previous state. As shown in the block 218, $SC_1$ corresponds to N=1.

If, however, the block 216 determines that the long cycle counter state is not 2, control passes to a block 220, which determines if the first short cycle counter has a state of 3 and the second short cycle counter has a state of 0. If the determination made by the block 220 is yes, control passes to a block 222, which effectively decrements the state of the second short cycle counter. The results of the step 222 may be seen in FIG. 6 at state 6 of the long cycle counter. As shown in the block 222, $SC_2$ corresponds to N=2. If, however, the block 220 finds that either the first short cycle counter does not have a state of 3 or the second short cycle counter does not have a state of 0, control passes to a block 224.

The block 224 determines whether the second short cycle counter has a state of 3 and the third short cycle counter has a state of 0. If the block 224 determines that the criteria is met, control passes to a block 226, which decrements the state of the third short cycle counter, as may be seen for long cycle counter state 10 in FIG. 6. As shown in the block 226, $SC_3$ corresponds to N=3. If, however, the criteria of the block 224 is not met, control passes to a block 228.

The block 228 determines whether the third short cycle counter has a state of 3 and the fourth short cycle counter has a state of 0. If the criteria of the block 228 is met, control passes from the block 228 to a block 230, which decrements the fourth short cycle counter, as may be seen in FIG. 4 at long cycle counter state 14. As shown in the block 230, $SC_4$ corresponds to N=4.

After completion of each of blocks 218, 222, 226, 230 control passes to a block 232. Additionally, if the criteria of the block 228 is not met, control will pass to the block 232. The block 232 determines whether any of the short cycle counters have a state of 0. If one or more of the short cycle counters has a state of 0, control passes from the block 232 to a block 234. The block 234 transfers the contents of memory element (N−1) to memory element (N). For example, as shown in FIG. 6 for long cycle counter state 7, when $\alpha 2=0$, x4 was transferred from the memory element 1 to the memory element 2. Step 234 is somewhat analogous to a shift function used in a conventional equalizer.

After the block 234 has completed operation, control passes to a block 236. Additionally, control will pass to the block 236 if the block 232 does not find any short cycle counters having a state of 0. The block 236 multiplies the contents of each memory element by its corresponding coefficient related to the short code cycle state and adds the results of the multiplications, together. Such a function may be referred to as a multiply and accumulate (MAC) function. As the block 236 calculates the various products of the coefficients and the memory element contents, various products may be stored by a block 238. These held products may be recalled from the block 238 and used for the MAC on subsequent executions of the block 236. For example, referring to long cycle counter state 2 of FIG. 6, the block 236 would multiply x1 by the 0 coefficient of $\alpha 4$, x2 by the 0 coefficient of $\alpha 3$, x3 by the 0 coefficient of $\alpha 2$ and x3 by the 3 coefficient of $\alpha 1$, which may be held in the hold block 104 (FIG. 4) from the calculations performed with respect to long cycle counter state 1. It is the results of the block 236 that are produced as output from the processor 202 as output from an upsample and filter function. After the block 236 has completed the multiply and accumulate function, control passes back to the block 212.

Figure 10:
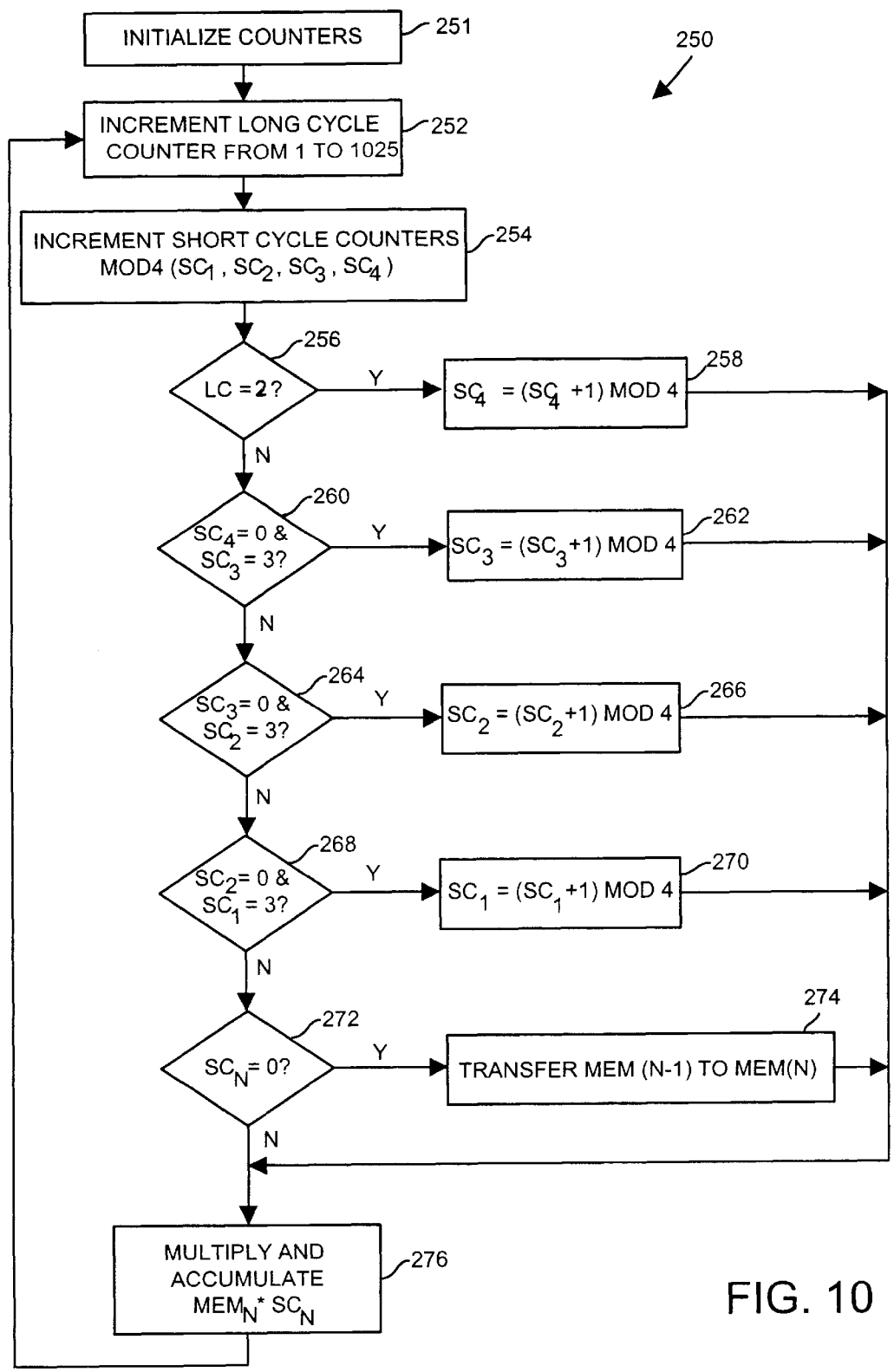
FIG. 10 is a flow diagram illustrating a process for skipping states of the coefficient generators to produce an output from the upsampler and filter of FIG. 3.

Referring now to FIG. 10, an upsampling and filtering process 250 for an undesired coefficient less than one (e.g., 1024/1025) includes a number of blocks. Like the process 210 described in connection with FIG. 9, the process 250 includes a long cycle counter (LC), four short cycle counters ($SC_1$–$SC_4$) and a number of memory locations, which may be conceptually represented as shown in FIG. 4. For example the memory elements may be referred to a memory elements 1–4 and data may be transferred between the memory elements. The long cycle counter and the short cycle counter states may be stored in the memory 204. Turning now to the operation of the process 250, at a block 251 the counters (both the long cycle counter and the short cycle counters) are initialized. After the counters are initialized, a block 252 increments the long cycle counter. As shown in the block 252, the long cycle counter increments from 1 to 1024 before looping back to 1. After the long cycle counter is incremented by the block 252, a block 254 increments the short cycle counters ($SC_1SC_4$) in MOD 4 fashion.

After the long and short cycle counters have been incremented, control passes to a block 256, which determines if the long cycle counter has a state of 2. If the long cycle counter does have a state of 2, control passes to a block 258, which adds one to the first short cycle counter (SC1) in MOD 4 fashion. Accordingly, the block 258 effectively increments the first short cycle counter. For example, as shown in FIG. 7, $\alpha 4$ for a long cycle counter state of 2 would have been 3, but has been effectively incremented to 0.

If, however, the block 256 determines that the long cycle counter state is not 2, control passes to a block 260, which determines if the fourth short cycle counter has a state of 0 and the third short cycle counter has a state of 3. If the determination made by the block 260 is yes, control passes to a block 262, which effectively increments the state of the second short cycle counter. The results of the step 262, may be seen in FIG. 7 at state 6 of the long cycle counter. If, however, the block 260 finds that either the fourth short cycle counter does not have a state of 0 or the third short cycle counter does not have a state of 3, control passes to a block 264.

The block 264 determines whether the third short cycle counter has a state of 0 and the second short cycle counter has a state of 3. If the block 264 determines that the criteria is met, control passes to a block 266, which increments the state of the second short cycle counter, as may be seen for long cycle counter state 10 in FIG. 7. If, however, the criteria of the block 264 is not met, control passes to a block 268.

The block 268 determines whether the second short cycle counter has a state of 0 and the first short cycle counter has a state of 3. If the criteria of the block 268 is met, control passes from the block 268 to a block 270, which increments the first short cycle counter, as may be seen in FIG. 7 at long cycle counter state 14.

After completion of each of blocks 258, 262, 266, 270 control passes to a block 272. Additionally, if the criteria of the block 268 is not met, control will pass to the block 272. The block 272 determines whether any of the short cycle counters have a state of 0. If one or more of the short cycle counter has a state of 0, control passes from the block 272 to a block 274. The block 274 transfers the contents of memory element (N−1) to memory element (N). For example, as shown in FIG. 7 for long cycle counter state 7, when $\alpha 2=0$, x4 was transferred from the memory element 1 to the memory element 2. Step 274 is somewhat analogous to a shift function used in an equalizer.

After the block 274 has completed operation, control passes to a block 276. Additionally, control will pass to the block 276 if the block 272 does not find any short cycle counters having a state of 0. Like the block 236 of FIG. 9, the block 276 multiplies each memory location by its corresponding coefficient related to the short code cycle state and adds the results of the multiplications together. It is the results of the block 276 that are produced as output from the processor 202 as output from an upsample and filter function. After the block 276 has completed the multiply and accumulate function, control passes back to the block 252.

Numerous modifications and alternative embodiments of the invention will be apparent to those skilled in the art in view of the foregoing description. For example, while the foregoing examples illustrate situations having an undesired coefficient of 1024/1025 or 1025/1024, those having ordinary skill in the art will recognize that these undesired coefficients are merely exemplary of the coefficients that may be used in conjunction with the digital filter disclosed herein. Accordingly, this description is to be construed as illustrative only and not as limiting to the scope of the invention. The details of the structure may be varied substantially without departing from the spirit of the invention, and the exclusive use of all modifications, which are within the scope of the appended claims, is reserved.

What is claimed is:

1. A filter for use in a digital communication system having a data source producing a data stream having a first frequency, a first portion and a second portion, the digital communication system further having a clock generator producing a signal having a second frequency that is equivalent to the first frequency multiplied by a desired coefficient and multiplied by an undesired coefficient, the filter comprising:

a first cycle counter communicatively coupled to the clock generator and producing a first periodic counting pattern having a number of states sequentially advanced by the clock generator, wherein the first cycle counter alters the first periodic counting pattern based on the undesired coefficient;

a first coefficient table communicatively coupled to the first cycle counter and producing coefficients corresponding to the first periodic counting pattern;

a first multiplier communicatively coupled to the first coefficient table and multiplying the first portion and the coefficients corresponding to the first periodic counting pattern to produce a first product signal;

a second cycle counter communicatively coupled to the clock generator and producing a second periodic counting pattern having a number of states sequentially advanced by the clock generator, wherein the second cycle counter alters the second periodic counting pattern based on the undesired coefficient;

a second coefficient table communicatively coupled to the second cycle counter and producing coefficients corresponding to the second periodic counting pattern;

a second multiplier communicatively coupled to the second coefficient table and multiplying the second portion and the coefficients corresponding to the second periodic counting pattern to produce a second product signal; and an adder adding the first product signal to the second product signal to produce an output of the filter.

2. The filter of claim 1, wherein the undesired coefficient is equivalent to a first integer divided by a second integer and wherein the first cycle counter alters the first periodic counting pattern by repeating a number of states when the first integer is larger than the second integer.

3. The filter of claim 2, wherein the number of states that are repeated per a number of states equal to the first integer is determined by the difference between the first integer and the second integer.

4. The filter of claim 2, wherein the number of times a state is repeated per a number of states equal to the first integer is equal to an integer part of a quotient of the first integer divided by the second integer.

5. The filter of claim 1, wherein the undesired coefficient is equivalent to a first integer divided by a second integer and wherein the first cycle counter alters the first periodic counting pattern by skipping a number of states when the first integer is smaller than the second integer.

6. The filter of claim 5, wherein the number of states that are skipped per a number of states equal to the first integer is determined by the difference between the second integer and the first integer.

7. The filter of claim 5, wherein the number of times a state is repeated per a number of states equal to the first integer is equal to an integer part of a quotient of the second integer divided by the first integer.

8. The filter of claim 1, wherein the first cycle counter alters the first periodic counting pattern before the second cycle counter alters the second periodic counting pattern.

9. The filter of claim 1, wherein the first cycle counter alters the first periodic counting pattern after the second cycle counter alters the second periodic counting pattern.

10. A filter for use in a digital communication system having a data source producing a data stream having a first frequency, a first portion and a second portion, the digital communication system further having a clock generator producing a signal having a second frequency that is equivalent to the first frequency multiplied by a desired coefficient and multiplied by an undesired coefficient, the filter comprising:

a first memory element storing the first portion;

a second memory element storing the second portion;

a first coefficient generator communicatively coupled to the clock generator and periodically producing a first pattern of coefficients having a number of states sequentially advanced by the clock generator, wherein the first coefficient generator alters the first pattern of coefficients based on the undesired coefficient;

a first multiplier communicatively coupled to the first coefficient generator and the first memory element, the first multiplier multiplying the first portion and the first pattern of coefficients to produce a first product signal;

a second coefficient generator communicatively coupled to the clock generator and periodically producing a second pattern of coefficients having a number of states sequentially advanced by the clock generator, wherein the second coefficient generator alters the second pattern of coefficients based on the undesired coefficient corresponding to the second periodic counting pattern;

a second multiplier communicatively coupled to the second coefficient generator and the second memory element, the second multiplier multiplying the second portion and the second pattern of coefficients to produce a second product signal; and an adder adding the first product signal to the second product signal to produce an output of the filter.

11. The filter of claim 10, wherein the undesired coefficient is equivalent to a first integer divided by a second integer and wherein the first coefficient generator alters the first pattern of coefficients by repeating a number of states when the first integer is larger than the second integer.

12. The filter of claim 11, wherein the number of states that are repeated per a number of states equal to the first integer is determined by the difference between the first integer and the second integer.

13. The filter of claim 11, wherein the number of times a state is repeated per a number of states equal to the first integer is equal to an integer part of a quotient of the first integer divided by the second integer.

14. The filter of claim 10, wherein the undesired coefficient is equivalent to a first integer divided by a second integer and wherein the first coefficient generator alters the first pattern of coefficients by skipping a number of states when the first integer is smaller than the second integer.

15. The filter of claim 14, wherein the number of states that are skipped per a number of states equal to the first integer is determined by the difference between the second integer and the first integer.

16. The filter of claim 14, wherein the number of times a state is repeated per a number of states equal to the first integer is equal to an integer part of a quotient of the second integer divided by the first integer.

17. The filter of claim 10, wherein the first coefficient generator alters the first pattern of coefficients before the second cycle counter alters the second periodic counting pattern.

18. The filter of claim 10, wherein the first coefficient generator alters the first pattern of coefficients after the second cycle counter alters the second periodic counting pattern.

19. A filtering method for use in a digital communication system having a data source producing a data stream having a first frequency, a first portion and a second portion, the digital communication system further having a clock generator producing a signal having a second frequency that is equivalent to the first frequency multiplied by a desired coefficient and multiplied by an undesired coefficient, the filtering method comprising the steps of:

producing a first periodic counting pattern having a number of states sequentially advanced by the clock generator;

altering the first periodic counting pattern based on the undesired coefficient;

producing coefficients corresponding to the first periodic counting pattern;

multiplying the first portion and the coefficients corresponding to the first periodic counting pattern to produce a first product signal;

producing a second periodic counting pattern having a number of states sequentially advanced by the clock generator;

altering the second periodic counting pattern based on the undesired coefficient;

producing coefficients corresponding to the second periodic counting pattern;

multiplying the second portion and the coefficients corresponding to the second periodic counting pattern to produce a second product signal; and adding the first product signal to the second product signal to produce an output of the filter.

20. The method of claim 19, wherein the undesired coefficient is equivalent to a first integer divided by a second integer and wherein the step of altering the first periodic counting pattern includes the step of repeating a number of states when the first integer is larger than the second integer.

21. The method of claim 20, wherein the step of altering the first periodic counting pattern includes the step of determining a difference between the first integer and the second integer.

22. The method of claim 20, wherein the step of altering the first periodic counting pattern includes the step of determining a number of times a state is repeated per a number of states equal to the first integer by determining an integer part of a quotient of the first integer divided by the second integer.

23. The method of claim 19, wherein the undesired coefficient is equivalent to a first integer divided by a second integer and wherein the step of altering the second periodic counting pattern includes the step of skipping a number of states when the first integer is smaller than the second integer.

24. The method of claim 23, wherein the step of altering the second periodic counting pattern includes the step of determining a difference between the second integer and the first integer.

25. The method of claim 23, wherein the step of altering the second periodic counting pattern includes the step of determining a number of times a state is repeated per a number of states by determining an integer part of a quotient of the second integer divided by the first integer.

26. The method of claim 19, wherein the step of altering the first periodic counting pattern includes the step of altering the first periodic counting pattern before the second cycle counter alters the second periodic counting pattern.

27. The filter of claim 19, wherein the step of altering the first periodic counting pattern includes the step of altering the first periodic counting pattern after the second cycle counter alters the second periodic counting pattern.

* * * * *